(12) United States Patent
Edmond et al.

(10) Patent No.: US 9,178,121 B2
(45) Date of Patent: Nov. 3, 2015

(54) REFLECTIVE MOUNTING SUBSTRATES FOR LIGHT EMITTING DIODES

(75) Inventors: John A. Edmond, Cary, NC (US); Hua-Shuang Kong, Cary, NC (US)

(73) Assignee: Cree, Inc., Durham, NC (US)

( * ) Notice: Subject to any disclaimer, the term of this patent is extended or adjusted under 35 U.S.C. 154(b) by 1696 days.

(21) Appl. No.: 11/611,600

(22) Filed: Dec. 15, 2006

(65) Prior Publication Data
US 2008/0142820 A1    Jun. 19, 2008

(51) Int. Cl.
*H01L 33/00* (2010.01)
*H01L 33/60* (2010.01)
*H01L 33/50* (2010.01)

(52) U.S. Cl.
CPC ............. H01L 33/60 (2013.01); *H01L 33/0079* (2013.01); *H01L 33/50* (2013.01); *H01L 2224/48091* (2013.01); *H01L 2224/48247* (2013.01)

(58) Field of Classification Search
USPC ............................................. 257/99, 103, 98
See application file for complete search history.

(56) References Cited

U.S. PATENT DOCUMENTS

| | | | |
|---|---|---|---|
| 3,783,353 A | 1/1974 | Pankove | |
| 5,959,316 A | 9/1999 | Lowery | |
| 6,643,304 B1 | 11/2003 | Chen et al. | |
| 6,797,987 B2 * | 9/2004 | Chen | 257/98 |
| 6,936,862 B1 | 8/2005 | Chang et al. | |
| 7,053,375 B2 * | 5/2006 | Ando et al. | 250/361 R |
| 7,115,915 B2 | 10/2006 | Shei et al. | |
| 7,259,042 B2 | 8/2007 | Tsai et al. | |
| 2002/0063520 A1 | 5/2002 | Yu et al. | |
| 2004/0140765 A1 | 7/2004 | Takekuma | |
| 2004/0214412 A1 | 10/2004 | Barnes et al. | |
| 2004/0217360 A1 | 11/2004 | Negley | |
| 2004/0217361 A1 | 11/2004 | Negley | |
| 2004/0217370 A1 | 11/2004 | Negley | |
| 2005/0127485 A1 | 6/2005 | Shei et al. | |
| 2005/0179364 A1 * | 8/2005 | Murazaki | 313/498 |
| 2005/0221519 A1 | 10/2005 | Leung et al. | |
| 2006/0002442 A1 * | 1/2006 | Haberern et al. | 372/46.01 |
| 2006/0012991 A1 * | 1/2006 | Weaver et al. | 362/235 |
| 2006/0060872 A1 * | 3/2006 | Edmond et al. | 257/94 |
| 2006/0060874 A1 * | 3/2006 | Edmond et al. | 257/98 |

(Continued)

FOREIGN PATENT DOCUMENTS

| | | |
|---|---|---|
| JP | H11-26811 A | 1/1999 |
| JP | 2002170989 A | 6/2002 |

(Continued)

OTHER PUBLICATIONS

Sapphire Table of General Properties; Jul. 31, 2009, <http://www.marketech-sapphire.com/pdfs/saptable.pdf>.*

(Continued)

*Primary Examiner* — Ha Tran T Nguyen
*Assistant Examiner* — Suberr Chi
(74) *Attorney, Agent, or Firm* — Myers Bigel Sibley & Sajovec, P.A.

(57) ABSTRACT

A light emitting diode is disclosed that includes a light emitting active structure formed from the Group III nitride material system, a bonding structure supporting the Group III nitride active structure, and a mounting substrate supporting the bonding structure. The mounting substrate includes a material that reflects at least fifty percent of light having the frequencies emitted by the active structure.

15 Claims, 3 Drawing Sheets

(56) References Cited

U.S. PATENT DOCUMENTS

| | | | |
|---|---|---|---|
| 2006/0060877 A1* | 3/2006 | Edmond et al. ............... | 257/99 |
| 2006/0098288 A1 | 5/2006 | Pan et al. | |
| 2006/0131599 A1 | 6/2006 | Slater, Jr. et al. | |
| 2006/0157721 A1* | 7/2006 | Tran et al. .................... | 257/98 |
| 2006/0189098 A1 | 8/2006 | Edmond | |
| 2007/0194330 A1 | 8/2007 | Ibbetson et al. | |
| 2007/0215895 A1* | 9/2007 | Amoh et al. .................. | 257/99 |

FOREIGN PATENT DOCUMENTS

| | | |
|---|---|---|
| JP | 2003-188421 A | 7/2003 |
| JP | 2003273407 A | 9/2003 |
| JP | 2004-095576 A | 3/2004 |
| JP | 2004119807 A | 4/2004 |
| JP | 2004-524681 A | 8/2004 |
| JP | 2004-274027 A | 9/2004 |
| JP | 2005-064233 A | 3/2005 |
| JP | 2005-142236 A | 6/2005 |
| JP | 2005-210117 A | 8/2005 |
| JP | 2005-252293 A | 9/2005 |
| JP | 2005-259888 A | 9/2005 |
| JP | 2006041284 | 2/2006 |
| JP | 2006-86300 | 3/2006 |
| JP | 2006-100500 | 4/2006 |
| JP | 2006-156506 | 6/2006 |
| JP | 2006-295162 | 10/2006 |
| JP | 2006-324685 | 11/2006 |
| JP | 2007245415 A | 9/2007 |
| WO | WO 98/12757 | 3/1998 |
| WO | WO 02/061803 A2 | 8/2002 |
| WO | WO 2006/003527 A1 | 1/2006 |
| WO | WO 2006/043796 A1 | 4/2006 |
| WO | WO 2006/093015 A1 | 9/2006 |
| WO | WO 2006/126330 A1 | 11/2006 |

OTHER PUBLICATIONS

Kruschwitz, Jennifer. "High Reflectors". Nov. 4, 2001. Web. Sep. 23, 2010. <http://www.kruschwitz.com/HR's.htm>.*

Gessman, et al, "AlGaInP light-emitting diodes with omni-directionally reflecting submount," Proceedings of SPIE vol. 4996 (2003) pp. 26-39.

German Office Action; re: German Application No. 10 2007 058 720.3-33; Oct. 29, 2009.

Official Action dated Sep. 16, 2010; corresponding to Japanese Patent Application No. 2007-322509.

Japanese Office Action and English Translation (8 pages), corresponding Japanese Application No. 2007-322509; Apr. 14, 2011.

Japanese Office Action, Japanese Patent Application No. 2010-279745; Jul. 22, 2011.

Japanese Office Action Corresponding to Japanese Patent Application No. 2011-154394; Mailing Date: Dec. 20, 2011; 4 pages.

Japanese Office Action Corresponding to Japanese Patent Application No. 2010-279745; Mailing Date: Dec. 20, 2011; 3 pages.

Japanese Appeal Board's Questioning Corresponding to Japanese Patent Application No. 2007-322509; Mailing Date: Mar. 13, 2012; Japanese Text, 3 Pages, English Translation Thereof, 4 Pages.

Japanese Office Action Corresponding to Japanese Patent Application No. 2011-259427; Mailing Date: Feb. 28, 2014; Foreign Text, 1 Page, English Translation Thereof, 2 Pages.

Japanese Office Action Corresponding to Japanese Patent Application No. 2011-154394; Mailing Date: Dec. 10, 2013; Foreign Text, 8 Pages, English Translation Thereof, 8 Pages.

Japanese Appeal Board's Questioning Corresponding to Japanese Patent Application No. 2010-279745; Mailing Date: Nov. 12, 2013; Foreign Text, 5 Pages, English Translation Thereof, 4 Pages.

Japanese Office Action Corresponding to Japanese Patent Application No. 2011-154394; Mailing Date: Jul. 9, 2013; Foreign Text, 3 Pages, English Translation, 3 Pages.

Japanese Office Action Corresponding to Japanese Patent Application No. 2011-259427; Mailing Date: Jul. 30, 2013; Foreign Text, 2 Pages.

Japanese Decision of Rejection Corresponding to Japanese Patent Application No. 2010-279745; Mailing Date: May 21, 2013; 3 Pages (Foreign Text Only).

Japanese Decision on Rejection Corresponding to Japanese Patent Application No. 2011-154394; Date of Mailing; Dec. 21, 2012, English Translation, 2 Pages.

Japanese Unfavorable Decision of Appeal Corresponding to Japanese Patent Application No. 2007-322509; Date of Mailing: Jan. 4, 2013, Foreign Text, 11 Pages.

Japanese Office Action Corresponding to Japanese Patent Application No. 2007-322509; Mailing Date: Aug. 14, 2012; Japanese Text, 3 Pages, English Translation Thereof, 4 Pages.

Office Action for corresponding Japanese Application No. 2010-279745, mailed Sep. 30, 2014 (13 pages, including translation).

* cited by examiner

REFLECTIVE MOUNTING SUBSTRATES FOR LIGHT EMITTING DIODES

BACKGROUND

The present invention relates to improving external light extraction from light emitting diodes (LEDs) and in particular relates to improving the external light extraction from white light emitting diodes formed in the Group III nitride material system A light emitting diode is a photonic device that emits light under the application of current. The current moves carriers (electrons or holes) across a p-n junction (or some functionally equivalent structure). When the injected carriers recombine (with holes or electrons respectively), they can emit light as the manner of releasing the energy from the recombination events.

In accordance with well-understood quantum theory, the energy of the recombination event is fundamentally established by the bandgap of the semiconductor material. Accordingly, the energy of the recombination can never exceed the bandgap, although in some cases depending upon doping and other characteristics, the energy may be somewhat less than the bandgap.

The light that falls within the visible spectrum has wavelengths of between about 390 and 770 nanometers (nm). When converted into energy equivalents using well-established relationships, this means that visible light can be created by recombination events in semiconductor materials that have bandgaps of at least about 1.8 electron volts (eV). As a result, diodes formed from some widely used semiconductor materials—e.g., silicon (1.1 eV)—cannot produce visible light.

Light emitting diodes have many of the same favorable characteristics as other solid-state devices. They tend to be reliable, physically robust, exhibit long lifetimes, and can be made at relatively low cost in large quantities. Accordingly, light emitting diodes have become extremely common in everyday use, particularly as indicator lights and in other lower-brightness applications.

More recently, illumination rather than just indication, has become a consistently attractive application of light emitting diodes. Illumination, however, typically requires white light. Many of the common materials (gallium phosphide, indium phosphide, gallium arsenide) used for light emitting diodes, however, have bandgaps that can only to produce lower-energy yellow or red light.

As is also well understood in the fields of optics and color perception, white light does not consist of a single frequency or narrow band of frequencies. Instead, white light represents a combination of frequencies that together produce the color white for the human eye.

Accordingly, two typical approaches are used to produce white light emitting diodes. In the first, individual red-emitting, green-emitting and blue-emitting diodes are combined in close proximity to generate white light from the combination of the red, green, and blue frequencies. In the second approach, a blue light emitting diode is used in combination with a phosphor, often a yellow-emitting phosphor, that emits in response to excitation from the blue LED. The combination of the blue and yellow frequencies can produce white light.

Accordingly, both approaches require blue light emitting diodes. In turn, because the wavelengths (frequencies) which the human eye perceives as blue fall in the range of between about 455 and 492 nanometers, only semiconductor materials with equivalent bandgaps of at least about 2.4 eV can produce blue light. Accordingly, the typical candidate materials for blue light emitting diodes (and thus for white-emitting diodes) are silicon carbide (SiC) and the Group III nitrides.

As between these two material systems, the Group III nitrides have the advantage of being direct emitters (silicon carbide is an indirect emitter). In a direct emitter, most of the energy from the recombination is emitted as the photon. In an indirect emitter, some of the energy is emitted as a photon, but most is emitted as vibrational energy. Accordingly, all other factors being equal, a direct emitter will produce light more efficiently than an indirect emitter and thus the Group III nitrides are increasingly preferred over silicon carbide for blue light emitting diodes.

For a number of reasons that are generally well understood in this art, when materials such as the Group III nitrides are used to produce a light emitting diode, the fundamental structure is a p-n junction formed between respective p-type and n-type layers of Group III nitride material. Generally speaking, high quality epitaxial layers can be grown in well-controlled systems.

Epitaxial layers, however, must be grown upon some type of substrate crystal. Appropriate large crystals of Group III nitrides, however, are difficult or commercially impractical to obtain and use as substrates for Group III nitride epitaxial layers. Accordingly, sapphire and silicon carbide are the two most typical choices for Group III nitride growth substrates.

Sapphire ($Al_2O_3$) offers transparency, which, as discussed further herein, can be a favorable factor in diode performance. Nevertheless, sapphire is insulating and cannot be conductively doped.

Silicon carbide has a better lattice match with the Group III nitrides than does sapphire thus reducing the difficulty of crystal growth and the resulting stress or strain on the epitaxial layers. Silicon carbide can also be conductively doped, giving more options for device design than does sapphire. Colorless silicon carbide is, however, harder to obtain than is colorless sapphire.

Nevertheless, all other factors being equal, higher-quality Group III nitride epitaxial layers, and thus higher-quality junctions and diodes, are formed on silicon carbide substrates rather than sapphire substrates.

Light emitting diodes, however, are used in context rather than in the abstract. As noted earlier, in many cases a white-emitting LED consists of a blue light emitting diode combined with a phosphor. Because a phosphor is typically a particulate mineral, it is usually dispersed in a polymer lens that covers and packages the blue-emitting LED chip. Thus, the structure, composition and orientation of the lens and phosphor will affect the overall performance of the packaged LED.

Furthermore, better brightness results have recently been obtained from Group III nitride epitaxial layer junctions that are first produced on a growth substrate of silicon carbide, then joined using a metal bonding system to a mounting substrate (often of a material other than SiC). The original SiC growth substrate is then removed to produce a diode structure with Group III nitride epitaxial layers on the metal bonding system, which in turn is on the mounting substrate.

For example, the EZBRIGHT™ diodes available from Cree, Inc., Durham, N.C., USA, the assignee of this application, are formed of epitaxial layers of Group III nitride mounted on a metal bonding structure that in turn joins to a silicon substrate. Silicon is used as the mounting substrate because it is well understood and widely available at relatively low cost.

Silicon, however, tends to absorb light at the frequencies produced by Group III nitride emitting structures. Accordingly, for any given number of photons produced by the light emitting diode, some of them will strike, and be absorbed by, the silicon mounting structure. Every photon that is absorbed in this manner reduces the external quantum efficiency of the diode.

As brief background, the efficiency of a diode; i.e., the amount of light it produces based on the amount of current applied, depends on two basic factors: first, the efficiency with which the diode creates photons from a given amount of current; and second, the efficiency with which the photons that are created actually leave the diode and its package and can be observed or perceived.

Some Group III nitride diode structures formed on silicon mounting substrates tend to be less bright than otherwise similar diodes formed on sapphire. Nevertheless, as noted above, Group III nitride layers grown on silicon carbide are, all other factors being equal, often better than those grown on sapphire.

Accordingly, the initial advantages of higher-quality Group III nitride layers grown on silicon carbide substrates tend to disappear when those layers are placed on certain light-absorbing mounting structures and incorporated into LED lamps using phosphors to create white light.

Therefore, a need exists for light emitting diode structures that maintain the initial advantages of Group III nitride layers grown on silicon carbide substrates even after the growth substrate has been removed and after the layers have been positioned on a mounting structure and after the structure has been formed into a lamp with a lens and a phosphor.

SUMMARY

In one aspect, the invention is a light emitting diode that includes a light emitting active structure formed from the Group III nitride material system, a bonding structure supporting the Group III nitride active structure, and a mounting substrate supporting the bonding structure. The mounting substrate includes a material that is other than a Group III nitride and that reflects at least fifty percent of light having the frequencies emitted by the active structure In another aspect, the invention is a method of forming a light emitting diode with increased external quantum efficiency compared to similar structures. The method includes the steps of forming an active structure from the Group III nitride material system on a growth substrate, bonding the Group III nitride active structure to a mounting wafer material that reflects at least fifty percent of light having the frequencies emitted by the active structure, removing the growth substrate from the Group III nitride active structure epitaxial layers, and adding ohmic contacts to respective p-type and n-type portions of the Group III nitride active structure.

In yet another aspect, the invention is an LED lamp with increased external quantum efficiency compared to otherwise similar structures. The lamp includes a lead frame, a light emitting diode on the lead frame that includes a semiconductor light emitting structure, a bonding system, and a mounting substrate. The mounting substrate includes a material other than the semiconductor in the light emitting structure and that reflects at least 50 percent of light having the frequencies emitted by the active structure, a lens encapsulating the diode on the lead frame, and a phosphor distributed in the lens for converting the light emitted by the diode into a second color that when combined with the color emitted by the diode produces white light.

In yet another aspect, the invention is a light emitting diode that includes a light emitting active structure formed from the Group III nitride material system, a bonding system supporting the active structure, the bonding structure having a reflective surface supporting the active structure and a reflective surface opposite the active structure, and a substantially transparent substrate.

The foregoing and other objects and advantages of the invention and the manner in which the same are accomplished will become clearer based on the followed detailed description taken in conjunction with the accompanying drawings.

DETAILED DESCRIPTION

The nature of light emitting diodes, Group III nitrides, and sapphire and silicon carbide substrates, are generally well understood in this art and need not be described in detail herein. Appropriate references include Sze, PHYSICS OF SEMI-CONDUCTOR DEVICES, 2d Edition (1981); Schubert, LIGHT-EMIT-TING DIODES, Cambridge University Press (2003) and, Zetterling, PROCESS TECHNOLOGY FOR SILICON CARBIDE DEVICES, Electronic Materials Information Service (2002).

Figure 1:
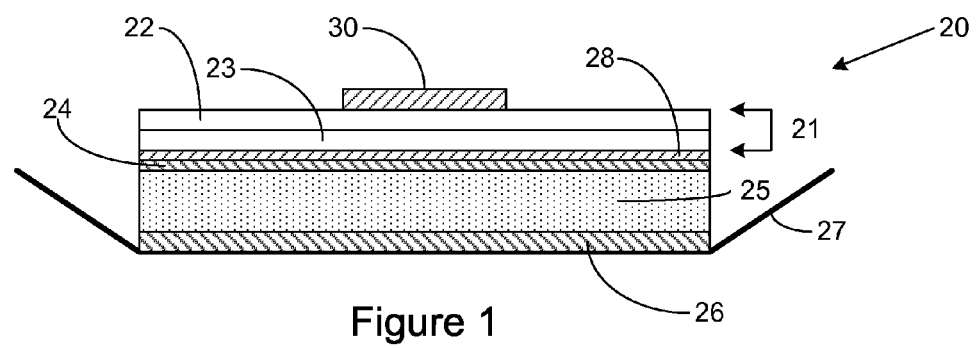
FIG. 1 is a schematic cross-sectional view of one embodiment of a diode according to the present invention.

FIG. 1 is a cross-sectional schematic view of a light emitting diode broadly designated at 20 according to the present invention. The diode 20 includes a light emitting active structure indicated by the bracketed arrows 21. In exemplary embodiments, the active structure 21 is formed from the Group III nitride material system. FIG. 1 illustrates the active structure as the epitaxial layers 22 and 23 that are n-type and p-type respectively.

Although FIG. 1 is exemplary rather than limiting, it does illustrate one of the useful orientations of the overall diode 20. It will further be understood that in all of the figures, items such as the diodes, epitaxial layers, lead frames, lenses, and other elements, are presented for illustration purposes rather than to scale.

The diode 20 next includes an ohmic layer 28 and a bonding system illustrated as the single layer 24. FIG. 1 illustrates the bonding system 24 as a single metal layer for purposes of clarity, but in exemplary embodiments, the bonding structure can be formed of a plurality of layers of appropriate metals and their alloys, or even of non-metals if they otherwise meet the structural and functional requirements of the diode. Representative combinations of metals are set forth in co-pending and commonly assigned application Ser. Nos. 11/428,158 and 11/534,317 filed Jun. 30, 2006 and Sep. 22, 2006 respectively for, "Nickel-Tin Bonding System for Semiconductor Wafers and Devices," and, "Modified Gold-Tin System With Increased Melting Temperature for Wafer Bonding." The contents of these applications are incorporated entirely herein by reference. In some embodiments, the bonding structure can include a relatively highly reflective metal layer adjacent the emitting structure 21 to serve as a mirror to enhance light extraction and external quantum efficiency.

The bonding structure 24 attaches the epitaxial layers 22 and 23 and the ohmic layer 28 to the mounting substrate illustrated at 25 in FIG. 1. As set forth with respect to the method aspects of the invention, and as generally well understood in the art, the epitaxial layers 22 and 23 are grown on a growth substrate (not shown) such as silicon carbide. This preliminary structure is then bonded to the mounting substrate 25 using the metal structure 24. The growth substrate is then removed to leave the epitaxial layers (or other active structure) 22 and 23 as the emitting face of the diode 20.

The mounting substrate 25 supports the bonding structure 24 and is formed of a material that is other than a Group III nitride and that reflects, from its exposed surfaces, at least 50 percent of light having the frequencies emitted by the active structure 21. In general, the mounting substrate 25 can also be described as reflecting light having the frequencies emitted by the active structure better than an equivalent silicon structure would reflect light having the frequencies emitted by the active structure.

Additionally, because the embodiments described herein are particularly useful in the context of a phosphor, the mounting substrate will also preferably reflect a substantial amount, in most cases at least 50 percent or more, of the light emitted by the phosphor after conversion.

The mounting substrate 25 is primarily selected for its light-reflecting characteristics. It must, of course, meet all of the other qualifications for use in an appropriate light emitting diode. Accordingly, the mounting substrate 25 should be formed of a material that is chemically stable, that can withstand LED fabrication temperatures (usually up to at least about 300° C.), that is at least as mechanically strong as silicon, has a high fracture strength, a high toughness, a high thermal conductivity, is rigid, will bond to the bonding system, and should be substantially non-toxic in the manufacturing context.

Accordingly, in exemplary embodiments the mounting substrate is selected from the group consisting of aluminum oxide (alumina), boron nitride, magnesium oxide, titanium dioxide, aluminum, other metals, porcelains, and other ceramics.

FIG. 1 illustrates an embodiment in which the mounting substrate 25 is conductive. Accordingly, one ohmic contact 26 can be placed on the back of the mounting substrate 25 to make an electrical contact to the lead frame 27. Another ohmic contact 30 is then made to the active structure 21, and in FIG. 1 is made to the n-type epitaxial layer 22.

The Group III nitride material system is generally well understood in this art and will not be described in detail other than to note that the epitaxial layers 22 and 23 are typically formed of gallium nitride, aluminum gallium nitride, indium gallium nitride, or in some cases indium aluminum gallium nitride. These compounds are generally indicated by the formulas GaN, $Al_xGa_{1-x}N$, $In_xGa_{1-x}N$ and $In_xAl_yGa_{1-x-y}N$ wherein x and y represent the atomic fraction of the indicated element. As well recognized in this art, the predominant wavelengths of the active structure can be to some extent controlled by controlling the atomic fraction of the elements, particularly indium, in the Group III nitride. This is to some extent counterbalanced by the greater stability of compounds with smaller atomic fractions of indium.

Additionally, although the active structure 21 is illustrated as the epitaxial layers 22 and 23, it will be understood that it can be selected from the group consisting of homojunctions, heterojunctions, single quantum wells, multiple quantum wells, and superlattice structures.

Figure 2:
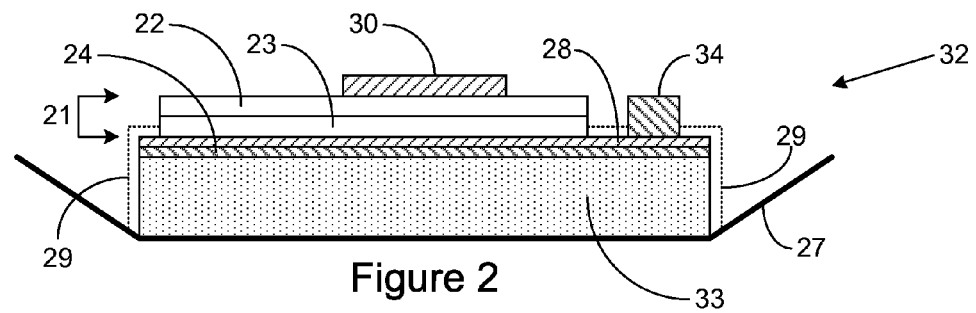
FIG. 2 is a schematic cross sectional view of a second embodiment of a diode according to the present invention.

FIG. 2 illustrates an embodiment of the diode broadly designated at 32 in which the mounting substrate 33 is insulating rather than conductive. The active structure is again illustrated at 21 and includes the n-type epitaxial layer 22, the p-type epitaxial layer 23, the bonding system 24 and the ohmic layer 28. Because the mounting substrate 33 is, however, insulating, a bond pad 34 provides contact to the ohmic layer 28 and thus to the p-type layer 23. In the embodiment illustrated in FIG. 2 the ohmic contact to the n-type layer is again indicated at 30.

The relevant materials for ohmic contacts to both p-type and n-type Group III nitrides are well understood in this art and will not be described in detail.

As an additional point, the ohmic contact layer 28 illustrated in FIG. 2 is shown as a single layer for purposes of clarity with respect to the remainder of the description. In many actual circumstances, the ohmic layer 28 will be slightly more complex. Typically, such a layer will include an ohmic contact on the p-type Group III nitride layer 23 (and will be underneath the layer 23 in the orientation illustrated in FIG. 2). This ohmic contact will be backed by a mirror, typically formed of silver (Ag), to enhance light extraction. In turn, because silver has a tendency to migrate in devices of this type, particularly during additional fabrication steps, the remainder of the layer is formed of a barrier metal system, most typically a titanium-tungsten (Ti—W) alloy.

Such a combination of metal layers is described, for example, in co-pending and commonly assigned patent application Ser. No. 11/037,965 filed Jan. 18, 2005, and now published as No. 20060060879, the contents of which are incorporated entirely herein by reference.

FIGS. 1 and 2 illustrate that in exemplary embodiments, the diode 20 or 32 is oriented with the epitaxial layers 22 and 23 on the substrate 25 or 33 and the substrate on the lead frame 27. In this orientation, the active structure 21 forms the emitting face of the respective diodes 20 and 32. The invention is useful in this context because the substrate does not otherwise interfere with the external production of light from the active structure 21. Although this orientation prevents the substrate 25 or 33 from physically blocking light leaving the active structure 21, the substrate can potentially absorb light reflected to it from the lead frame 27, the lens, or the phosphor (FIG. 3) or any combination of these elements.

In another embodiment, and as indicated by the dotted lines in FIG. 2, the substrate 33, whether or not inherently reflective, can be coated with a reflective material 29. The reflective material 29 will meet the same qualifications as the reflective substrate and can be selected from the same group of materials. In some circumstances, the coating could be formed of a material that meets the criteria for reflective purposes, but would not necessarily meet the structural requirements for an entire substrate. In such embodiments, the substrate could be formed of one of the less reflective materials and meet the structural requirements for the substrate while the coating could be formed of a reflective material that served the reflective purpose.

Figure 3:
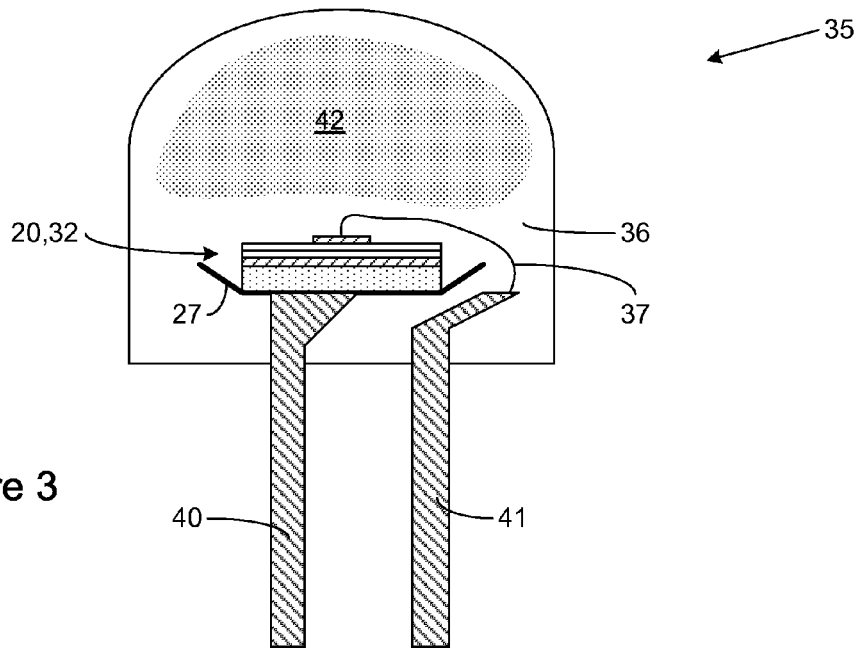
FIG. 3 is a schematic cross-sectional diagram of an LED lamp that includes the diode according to the present invention.

FIG. 3 illustrates the invention in the context of an LED lamp broadly designated at 35. As with respect to FIGS. 1 and 2, FIG. 3 is schematic in nature and certain items are illustrated disproportionately as compared to actual sizes. In particular, in an LED lamp the diode chip 20 or 21 would be proportionally smaller compared to the lens 36. The lens 36 encapsulates the diode 20 or 21 on the lead frame 27 and, depending upon whether the substrate is conductive or insulating, one or more wires 37 can be used to connect the ohmic contact 30 to the external leads 40 and 41.

The diode 20 or 32 is typically mounted on the lead frame 27 in the lamp context using an appropriate solder bond or adhesive, but as this is well understood in the art, it has been avoided in FIG. 3 for purposes of clarity.

In exemplary embodiments, the lamp 35 includes a phosphor schematically illustrated by the dotted field 42 in FIG. 3. As noted in the Background, the phosphor is typically a particulate mineral that fluoresces in response to light excitation. For white light emitting diodes based upon the Group III nitride material system, the phosphor 42 is selected to predominantly emit in the red and yellow frequencies to complement the blue frequencies emitted by the diode 20 or 32 so that the combination produces white light. The most common and exemplary phosphor for this point is yttrium aluminum garnet ($Y_3Al_5O_{12}$) commonly referred to as "YAG" and its analogous compositions. The phosphor 42 is typically cast in the lens 36 which in turn typically comprises a polymer, although it can be formed of glass or other transparent materials. Because polymers are organic molecules and in many cases responsive to light in the blue and ultraviolet frequencies, the lens 36 is preferably formed of a polymer that is less affected or substantially unaffected by the emission of blue or yellow light. In particular the siloxane-based polymers, often referred to informally as "silicones," are appropriate in this context.

Figure 4:
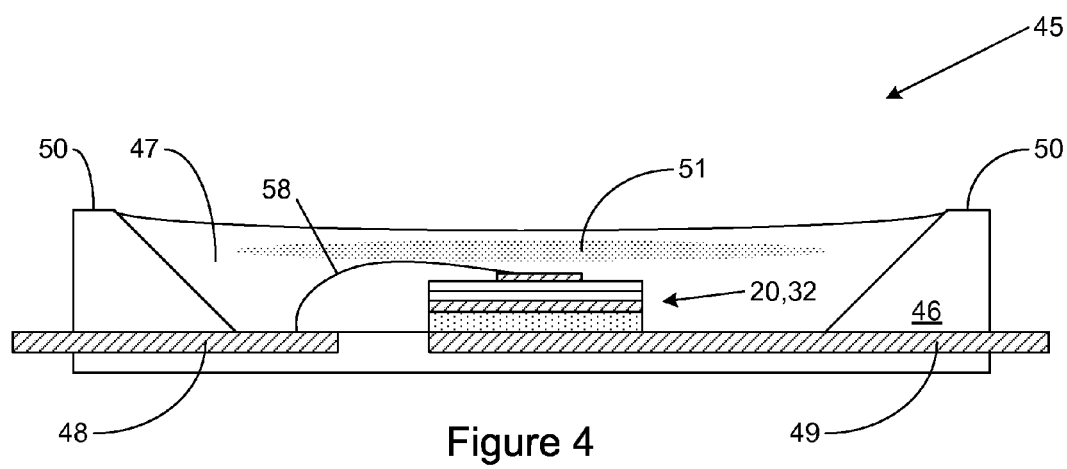
FIG. 4 is a sidelooker lamp that incorporates the LED chip according to the present invention.

Although FIGS. 3 and 4 illustrate the phosphor 42 and 51 respectively as being dispersed in the polymer lens above the diode 20, 32; it will be understood that the phosphor's location is not limited to these positions. The phosphor can be placed in some circumstances directly on the chip 20, 32 or at the border (inside surface) of the lens (e.g., 36), or in any other position or pattern that serves the intended purpose. Stated differently, the reflective mounting substrate offers its advantages in combination with a wide possibility of placement of the phosphor 42, 51.

Figure 6:
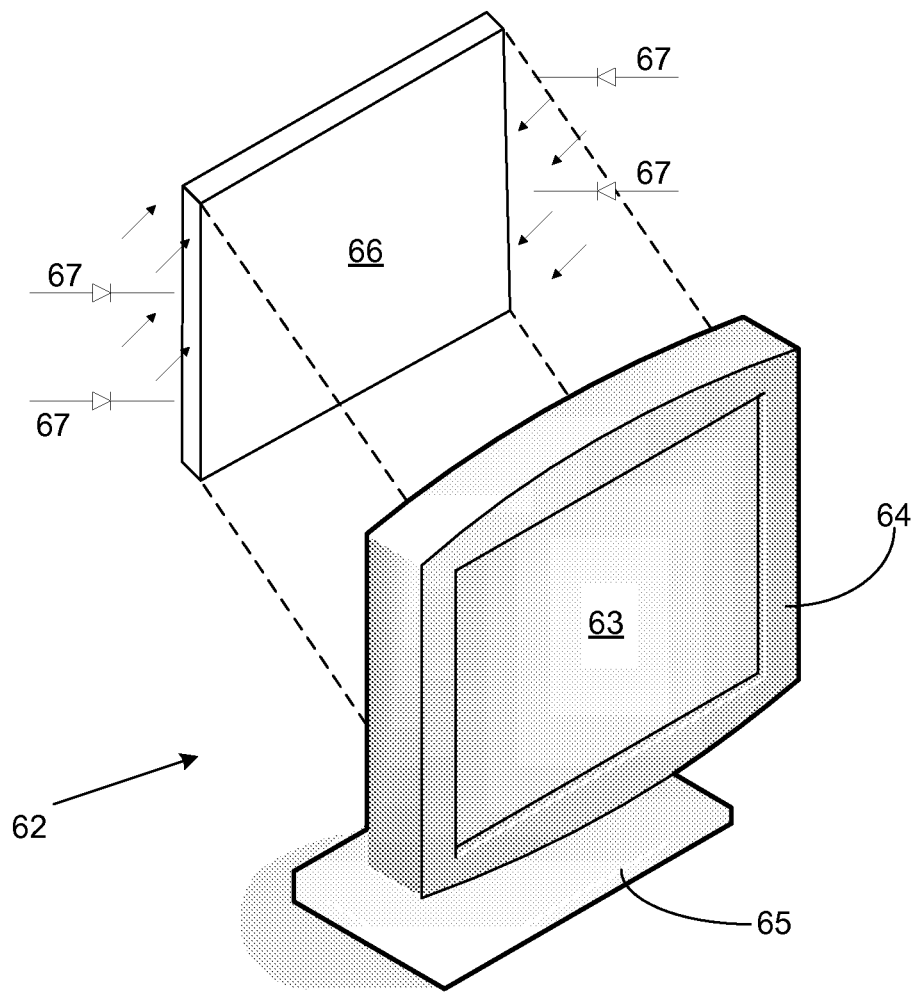
FIG. 6 is a partially schematic view of a display that incorporates diodes according to the present invention.

FIG. 4 illustrates the invention in the context of a "sidelooker" diode structure broadly designated at 45. The term sidelooker generally refers to a diode 20 or 32 according to the invention positioned and arranged in a particular package environment. A sidelooker diode typically includes a reflective package 46, often formed of a white polymer resin, in which the diode 20 or 32 is mounted underneath a polymer lens 47 that has a concave profile with respect to the housing 46 and the diode 20 or 32. This is an accepted commercial orientation and the concave lens 47 permits the top surface 50 of the sidelooker diode 45 to be placed flush against an object to be illuminated, such as the diffuser of a flat display (FIG. 6).

Because sidelooker diodes such as the illustrated diode 45 are frequently used as backlighting for full-color displays, they typically also include a field of phosphor 51 that converts light from the diode 20 or 21 into yellow light that, as explained earlier, combines with the blue light emitted by the diode 20, 21 to give white light output. As noted with respect to the earlier embodiment, the illustrated location of the phosphor 51 is exemplary rather than limiting.

The sidelooker package 45 will also include appropriate package contacts 48, 49 bond pads, and wires (e.g. 58) from the diode 20 or 32 to the package contacts. These have been simplified in FIG. 4 for clarity's sake, but are otherwise well understood in the art.

The reflective substrate according to the invention provides particular advantages with respect to a sidelooker diode. Because a sidelooker diode typically includes the concave lens, it provides a higher probability of internal reflection then does the more common lamp package and convex lens. Thus, because of the greater tendency for internal reflection in a conventional sidelooker diode, the invention provides a particular advantage in the manner in which the reflecting substrate increases the external quantum efficiency of the diode by minimizing the number of photons absorb by the substrate.

The lens and phosphor structures illustrated in FIG. 3 and FIG. 4 highlight certain benefits of the invention. As described in the Background, the external quantum efficiency of a diode represents the amount of light that the package produces, usually in proportion to the applied current. In actual practice some of the photons—both those emitted by the diode and those emitted by the phosphor—that strike the edge of the lens will be reflected back into the package (based upon Snell's law and depending upon the angle of incidence and the relevant index of refraction). When such reflected photons strike the reflective substrate (25 or 33) according to the invention, they will be reflected back and have a statistically greater probability of externally exiting the lamp 35 or 45.

The same advantage holds true with respect to the phosphor (42 in FIGS. 3 and 51 in FIG. 4). Because some, but not all, of the photons that strike the phosphor generate a conversion, some of the photons are reflected from the phosphor particles and can be reflected back to the substrate 25 or 33. Because the invention provides a reflective substrate, this likewise increases the probability that such reflected photons will eventually exit the package and increase the external output and thus efficiency of the lamp 35 or 45.

Figure 5:
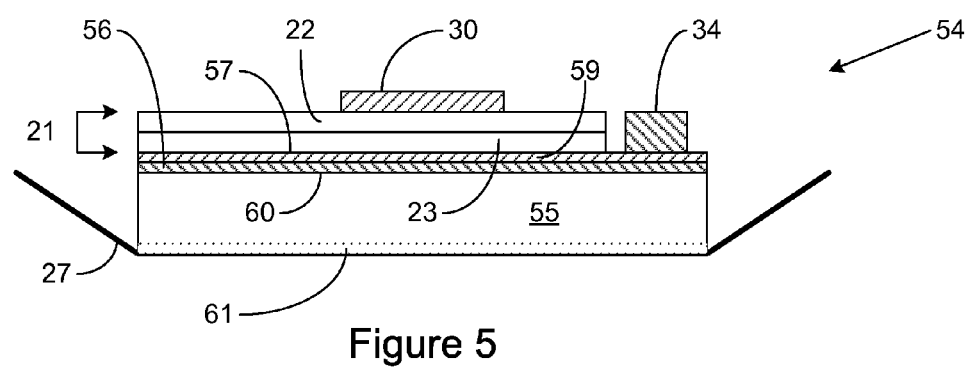
FIG. 5 is a cross-sectional schematic illustration of a third embodiment of a diode according to the present invention.

FIG. 5 schematically illustrates another embodiment of the invention in the form of a diode 54 that incorporates a transparent substrate 55. One of the advantages of the previously-described embodiments is that the reflective properties of the mounting substrates minimize or eliminate the absorption of light by the substrate. In the diode 54 illustrated in FIG. 5, the transparent substrate 55 will absorb a certain number of photons. In this embodiment, however, the bonding metal system 56 has one reflective surface 57 that supports the active structure 21 (like elements having the same reference numerals as in the previous illustrations) and another reflective surface 60 opposite the active structure 21 and immediately supported by the substrate 55. This provides two reflective surfaces 60 and 57 so that some of the photons that enter the transparent substrate 55 can be reflected outwardly again by the reflective surface 60 that faces the substrate 55.

In some embodiments, the lead frame 27 can include a reflective surface illustrated by the dotted section 61. The reflective surface 61 on the lead frame 27 can be used in place of, or in conjunction with, the reflective surface 60 on the bonding structure 56. Additionally, in some cases it is advantageous for the reflective surfaces to be "rough"; i.e., to be formed of a plurality of small reflective structures as an option to being a planar reflective surface.

FIG. 5 further illustrates an embodiment in which the transparent substrate 55 is insulating rather than conductive. Accordingly, in a manner analogous to FIG. 2 the ohmic contacts 30 and 59 are made to the epitaxial layers 22 and 23 in the active structure 21 rather than to the substrate 55. In turn, the metal bond pad 34 provides external contact to the ohmic layer 59 and the p-type layer 23. It will be understood, of course, that a transparent substrate with the reflecting surfaces 57 and 60 on the metal bonding system 56 could also be incorporated with a conductive substrate, and that such a structure would be analogous to FIG. 1. In general, however, adding dopants tends to reduce the transparency of any given crystal material and thus transparent substrates are more commonly insulating.

It will also be understood that the structure of the metal layer 59 can be more detailed than illustrated in FIG. 5. In particular, the combination of an ohmic contact, a mirror layer, and a barrier layer set forth with respect to FIG. 2 can also be incorporated in the embodiment of FIG. 5.

FIG. 6 illustrates a partially exploded display broadly designated at 62 that incorporates diodes and lamps according to the present invention. FIG. 6 schematically represents backlighting structures used in items such as cellular telephones, personal digital assistants, laptop computers, and related color displays in other applications (e.g., flat panel video and computer monitors and global positioning systems). Those familiar with backlighting structures will recognize that in many cases they include a number of additional relevant elements such as protective films, top masks, housings, reflectors, and light management films. Because these elements are generally well understood in the art, and because specific descriptions of these do not necessarily enhance the description of the present invention, they will not be otherwise described in detail herein.

The display 62 includes color pixels generically indicated by the screen 63 in the supporting frame 64 and its base 65. A light guide 66 is positioned adjacent to the pixels 63. In exemplary embodiments, the color pixels comprise a liquid crystal display of the type generally well understood in this art and which will otherwise not be described in detail herein.

The light guide 66 is typically formed of an appropriate polymer with a refractive index that provides it with excellent light transmission capacity.

The display 62 includes at least one light emitting diode 67, and preferably a plurality of such diodes, according to any one or more embodiments of the invention, particularly including the sidelooker diode described with respect to FIG. 4. As illustrated in FIG. 6, the display 62 defines a generally planar viewing area with the light guide 66 oriented generally (or precisely) parallel to the planar viewing area. The light emitting diodes 67 are positioned to direct light normal to the plane of the viewing area; i.e., they are positioned around the edge of the light guide 66 for this purpose.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
a light emitting active structure formed from a Group III nitride material system;
a bonding structure; and
a mounting substrate,
a first ohmic contact to a p-type portion of said light emitting active structure; and a second ohmic contact to an n-type portion of said light emitting active structure,
said mounting substrate comprising a material such that a surface of the mounting substrate reflects at least fifty percent of light having the frequencies emitted by said active structure, wherein said bonding structure is between said Group III nitride light emitting active structure and said mounting substrate.

2. A light emitting diode according to claim 1 wherein said bonding structure is a metal bonding structure.

3. A light emitting diode according to claim 1 wherein said mounting substrate comprises a material that is other than a Group III nitride.

4. A light emitting diode according to claim 1 wherein the material of said mounting substrate has a higher reflectivity than silicon for the light having frequencies emitted by said active structure.

5. A light emitting diode according to claim 1 wherein said active structure comprises epitaxial layers from a Group III nitride material system.

6. A light emitting diode according to claim 1 wherein said active structure is selected from the group consisting of homojunctions, heterojunctions, single quantum wells, multiple quantum wells, and super lattice structures.

7. A light emitting diode according to claim 1 wherein said mounting substrate is selected from the group consisting of aluminum oxide, boron nitride, magnesium oxide, titanium dioxide, aluminum, other metals, porcelains, and other ceramics.

8. A light emitting diode according to claim 1 wherein said mounting substrate is insulating.

9. A light emitting diode according to claim 1, wherein said mounting substrate is conductive, and further comprising a first ohmic contact to said conductive mounting substrate; and a second ohmic contact to said active structure.

10. A light emitting diode according to claim 1 wherein said mounting substrate is chemically stable, can withstand LED fabrication temperatures, is at least as mechanically strong as silicon, has a high fracture strength, has a high toughness, a high thermal conductivity, is rigid, will bond to said bonding structure, and is substantially nontoxic in the LED manufacturing context.

11. A light emitting diode according to claim 1 wherein said mounting substrate is physically and chemically stable at temperatures up to at least about 300° C.

12. A light emitting diode according to claim 1 wherein said active structure is selected from the group consisting of gallium nitride, indium gallium nitride, aluminum gallium nitride, and combinations thereof.

13. A light emitting diode according to claim 1 wherein said bonding structure is metal and includes gold, tin, platinum and/or nickel.

14. A light emitting diode according to claim 1 further comprising a lens and a phosphor and wherein said mounting substrate material reflects a substantial amount of the light emitted by said phosphor.

15. A light emitting diode according to claim 1 wherein said mounting substrate material reflects at least fifty percent of light having a wavelength of between about 350 and 700 nanometers.

* * * * *